United States Patent
Benas-Sayag et al.

(10) Patent No.: US 7,045,791 B2
(45) Date of Patent: May 16, 2006

(54) COLUMN SIMULTANEOUSLY FOCUSING A PARTILCE BEAM AND AN OPTICAL BEAM

(75) Inventors: Gérard Benas-Sayag, Saint Orens (FR); Patrick Bouchet, Trets (FR); Antoine Corbin, Aix-en-Provence (FR); Pierre Sudraud, Puyloubier (FR)

(73) Assignees: Credence Systems Corporation, Milpitas, CA (US); Orsay-Physics, S.A., Fuveau (FR)

( * ) Notice: Subject to any disclaimer, the term of this patent is extended or adjusted under 35 U.S.C. 154(b) by 40 days.

(21) Appl. No.: 10/239,293

(22) PCT Filed: Mar. 19, 2001

(86) PCT No.: PCT/FR01/00812

§ 371 (c)(1),
(2), (4) Date: Jan. 13, 2003

(87) PCT Pub. No.: WO01/71766

PCT Pub. Date: Sep. 27, 2001

(65) Prior Publication Data

US 2003/0102436 A1 Jun. 5, 2003

(30) Foreign Application Priority Data

Mar. 20, 2000 (FR) .......................................... 00 03501

(51) Int. Cl.
*G01N 23/00* (2006.01)
*H01J 3/14* (2006.01)

(52) U.S. Cl. ................... 250/396 R; 250/306; 250/310; 250/397; 250/492; 250/492.2; 250/492.3; 250/428

(58) Field of Classification Search ................. 313/542; 355/68; 250/201.3, 559.45, 492.24, 306, 250/310, 396 R, 397, 492, 492.2, 492.3, 250/428, 311, 309, 398
See application file for complete search history.

(56) References Cited

U.S. PATENT DOCUMENTS

| 3,845,305 A | 10/1974 | Liebl |
| 3,936,639 A | 2/1976 | Barrett ...................... 250/369 |
| 3,961,197 A | 6/1976 | Dawson ...................... 250/493 |
| 3,970,960 A | 7/1976 | Mollenauer ............ 331/94.5 F |

(Continued)

FOREIGN PATENT DOCUMENTS

| FR | 2245937 A * | 5/1975 |
| FR | 2 437 695 | 9/1979 |
| WO | WO 99/39367 A1 | 8/1999 |
| WO | WO 00/22670 A1 | 4/2000 |
| WO | WO 01/04611 A2 | 1/2001 |
| WO | WO 01/27967 A1 | 4/2001 |
| WO | WO 01/54163 A1 | 7/2001 |
| WO | WO 01/59806 A1 | 8/2001 |
| WO | WO 01/63266 A2 | 8/2001 |

OTHER PUBLICATIONS

H. Liebl, Mass Spectrometry of Solids—With Special Emphasis on Probe Sampling, Mikrochimica Acta (Wien) 1978 I, 241–259.

(Continued)

*Primary Examiner*—Frank G. Font
*Assistant Examiner*—Mary El-Shammaa
(74) *Attorney, Agent, or Firm*—Dorsey & Whitney LLP

(57) ABSTRACT

The invention concerns a column for producing a focused particle beam comprising: a device (100) focusing particles including an output electrode (130) with an output hole (131) for allowing through a particle beam (A); an optical focusing device (200) for simultaneously focusing an optical beam (F) including an output aperture (230). The invention is characterized in that said output aperture (230) is transparent to the optical beam (F), while said output electrode (130) is formed by a metallic insert (130) maintained in said aperture (230) and bored with a central hole (131) forming said output orifice.

20 Claims, 2 Drawing Sheets

U.S. PATENT DOCUMENTS

| | | | |
|---|---|---|---|
| 4,009,391 A | 2/1977 | Janes et al. | 250/281 |
| 4,017,730 A | 4/1977 | Barrett | 250/363 S |
| 4,076,420 A | 2/1978 | De Maeyer et al. | 356/73 |
| 4,087,763 A | 5/1978 | George et al. | 331/94.5 PE |
| 4,153,675 A | 5/1979 | Kleinerman | 424/8 |
| 4,255,661 A | 3/1981 | Liebl | |
| 4,330,295 A | 5/1982 | Taylor et al. | 23/230 M |
| 4,345,331 A | 8/1982 | Hoag | 372/87 |
| 4,418,283 A | 11/1983 | Trotel | 250/492.2 |
| 4,440,475 A * | 4/1984 | Colliaux | 250/396 R |
| 4,443,278 A | 4/1984 | Zingher | 156/64 |
| 4,551,599 A | 11/1985 | Liebl | |
| 4,578,279 A | 3/1986 | Zingher | 427/10 |
| 4,670,685 A | 6/1987 | Clark, Jr. et al. | 313/230 |
| 4,673,257 A | 6/1987 | Rokni et al. | 350/354 |
| 4,714,902 A | 12/1987 | Rokni et al. | 332/7.51 |
| 4,755,683 A | 7/1988 | Bell et al. | 250/423 R |
| 4,764,674 A * | 8/1988 | Kinoshita | 250/306 |
| 4,782,840 A | 11/1988 | Martin, Jr. et al. | 128/654 |
| 4,788,431 A | 11/1988 | Eckes et al. | 250/397 |
| 4,797,892 A | 1/1989 | DeFreez et al. | 372/50 |
| 4,988,879 A | 1/1991 | Zare et al. | 250/423 P |
| 4,990,776 A * | 2/1991 | Fushimi et al. | 250/310 |
| 5,020,411 A | 6/1991 | Rowan | 89/1.11 |
| 5,061,838 A | 10/1991 | Lane et al. | 219/121.59 |
| 5,063,586 A | 11/1991 | Jewell et al. | 378/34 |
| 5,192,866 A * | 3/1993 | Komi | 250/310 |
| 5,202,744 A | 4/1993 | Louis | 356/73 |
| 5,206,594 A | 4/1993 | Zipf | 324/464 |
| 5,221,561 A | 6/1993 | Flicstein et al. | 427/534 |
| 5,342,283 A | 8/1994 | Good | 600/8 |
| 5,359,621 A | 10/1994 | Tsunoda et al. | 372/82 |
| 5,394,500 A | 2/1995 | Marchman | 385/123 |
| 5,401,973 A | 3/1995 | McKeown et al. | 250/492.3 |
| 5,434,420 A | 7/1995 | McKeown et al. | 250/396 R |
| 5,451,794 A | 9/1995 | McKeown et al. | 250/492.3 |
| 5,485,277 A | 1/1996 | Foster | 356/445 |
| 5,488,681 A | 1/1996 | Deacon et al. | 385/37 |
| 5,491,762 A | 2/1996 | Deacon et al. | 385/16 |
| 5,504,772 A | 4/1996 | Deacon et al. | 372/102 |
| 5,598,002 A * | 1/1997 | Todokoro et al. | 250/310 |
| 5,679,952 A * | 10/1997 | Lutwyche et al. | 250/306 |
| 5,821,549 A | 10/1998 | Talbot et al. | |
| 5,827,786 A | 10/1998 | Puretz | 438/789 |
| 5,905,266 A | 5/1999 | Larduinat et al. | |
| 5,936,237 A | 8/1999 | van der Weide | 250/234 |
| 5,945,672 A | 8/1999 | Knowles et al. | 250/310 |
| 6,014,203 A * | 1/2000 | Ohkawa | 355/68 |
| 6,054,713 A * | 4/2000 | Miyake et al. | 250/492.24 |
| 6,087,673 A * | 7/2000 | Shishido et al. | 250/559.45 |
| 6,211,527 B1 | 4/2001 | Chandler | 250/492.2 |
| 6,268,606 B1 | 7/2001 | Abe et al. | 250/396 R |
| 6,333,497 B1 * | 12/2001 | Shimada et al. | 250/201.3 |
| 6,373,070 B1 | 4/2002 | Rasmussen | |
| 6,376,985 B1 * | 4/2002 | Lee et al. | 313/542 |
| 6,539,521 B1 | 3/2003 | Pierrat et al. | 716/4 |

OTHER PUBLICATIONS

H. Liebl, Ion optics for surface analysis, Inst. Phys. Conf. Ser. No. 38, 1978, Chapter 6, pp. 266–281.

H. Liebl, New Trends in Instrumentation, US–Japan Seminar on SIMS, Oct. 22–28, 1978, Osaka, pp. 205–210.

H. Liebl, Combined Electrostatic Objective and Emisssion Lens, International Journal of Mass Spectrometry and Ion Physics, 46 (1983), pp. 511–514.

H. Liebl et al., Ion Optics of Submicron Ion Beams, Scanning Electron Microscopy/1986/III, pp. 793–798.

H. Liebl, et al., Low–energy electron microscope of novel design, Ultramicroscopy 36 (1991) 91–98.

B. Senftinger et al., Performance Evaluation of a Novel Type of Low–Energy Electron Microscope, Proceedings of the Xllth International Congress for Electron Microscopy (1990) 354–355.

T.A Whatley et al., Perfomance Evaluation of an Ion Micrprobe, Proc. 6th Int. Conf. X–Ray Optics and Microanalysis, Tokyo 1971, Univ. Tokyo Press 1972, pp. 417–522.

H. Liebl, Ion Microscope Mass–Analyzer, Journal of Applied Physics, vol. 38, No. 13, Dec. 1967, pp. 5277–5283.

H. Tamura et al., Microprobe for the Ion Bombard Mass Analyzer, Recent Developments in Mass Spectroscopy, Proceeding of the International Conference on Mass Spectroscopy, Kyoto, 1970, pp. 205–209.

H. Liebl, The Ion Microprobe–Instrumentation and Techniques, NBS Spec. Publ. 427, Workshop on Secondary Ion Mass Spectrometry and Ion Microprobe Mass Analysis, 1974, pp. 1–31.

H. Liebl, Ion Microprobe Analysers: History and Outlook, Analytical Chemistry, vol. 46, No. 1, Jan. 1974, pp. 22–30.

H. Liebl, Design of a combined ion and electron microprobe apparatus, Int. J. Mass Spectrom. Ion Phys., 6 (1971) pp. 401–412.

H. Liebl, Ionen–Mikrosonden–Analysatoren, messtecnik 12/72, pp. 358–365.

G. Mollenstedt et al., Electron Emission Microscopy, published in Advances in Electronics and Electron Physics, No. 18 (1963). pp 251–329.

A. Benninghoven et al., Secondary Ion Mass Spectrometry, John Wiley & sons, 1987, pp 601–639.

Davis, A. M., et al., "Microbeam Laser Resonant Ionization Mass Spectrometry For Isotopic Compositions of Individual Grains of Stardust", Eleventh Annual V.M. Goldschmidt Conference, 1 page, (2001).

Ma, Z., et al., "New Instrument For Microbeam Analysis Incorporating Submicron Imaging and Resonance Ionization Mass Spectrometry", Rev. Sci. Instrum., vol. 66, No. 5, pp. 3168–3176, (May 1995).

Reynolds, G. O., et al., The New Physical Optics Notebook: Tutorials in Fourier Optics, Spie Optical Engineering press, Bellingham, Washington, pp. 478–479, (1989).

Sengupta, M., et al, "Subresolution Placement Using Infrared Image Alignment to the Computer–Aided Design Database for Backside Probing and Editing", J. Vac. Sci. Technol. B 19 (6), pp. 2878–2883 (Nov./Dec. 2001).

Sengupta, M., et al., "Through–Silicon IR Image to CAD Database Alignment", Article, Schlumberger Probe Systems, (date unknown).

Thompson, M.A., et al., Coaxial, Photon–Ion Technology Enables Direct Navigation to Buried Nodes on Planarized Surfaces, Including Silicon, Article, NPTest, Inc., pp. 1–10, (date unknown).

Tsao, C.–C., et al., "Coaxial Ion–Photon System", Article, Schlumberger Technologies and Orsay Physics, (date unknown).

Tsao, C.–C, et al., "Imaging and Material Analysis from Sputter–Induced Light Emission Using Coaxial Ion–Photon Column", Article, NPTest, (date unknown).

Tsao, C.–C., et al., "Editing of IC Interconnects Through Back Side Silicon With A Novel Coaxial Photon–Ion Beam Column", Article, Schlumberger Probe Systems and Orsay Physics, (date unknown).

Wang, Q. S., et al., "Effect of Ga Staining Due to FIB Editing on IR Imaging of Flip Chips", Article, Schlumberger Probe Systems and IBM, (date unknown).

"IDS OptiFIB", brochure, Schlumberger Semiconductor Solutions, (Apr. 2002).

"Duoplasmatron", http://www.tunl.duke.edu/~consen/phy217/MottScatteringReport/node11.html, 2 pages, (at least as early as Dec. 9, 2003).

"Secondary Ion Mass Spectrometry (SIMS)", Catalogue of Methods of IFS/IFW Dresden, http://www.ifw–dresden.de/ifs/mk/31/mk_sims_e.htm, 3 pages, (Mar. 3, 2000).

"Nanosolutions", Brochure, Orsay Physics, 12 pages (date unknown).

Unknown Author, "Physical Electronics and Photonics", pp. 14 and 15, (date unknown).

"SIMS Primary Ion Sources", Charles Evans & Associates, http://www.evanstexas.com/cai/simsinst/sources.htm, 2 pages, (at least as early as Dec. 5, 2003).

"SIMS Primary Ion Column", Charles Evans & Associates, http://www.evanstexas.com/cai/simsinst/column.htm, 2 pages, (at least as early as Dec. 5, 2003).

"Secondary Ion Extraction and Transfer", Charles Evans & Associates, http://www.evanstexas.com/cai/simsinst/transfer.htm, 2 pages, (at least as early as Dec. 5, 2003).

"Ion Energy Analyzers", Charles Evans & Associates, http://www.evanstexas.com/cai/simsinst/e anal.htm, 2 pages, (at least as early as Dec. 5, 2003).

"Mass Analyzers", Charles Evans & Associates, http://www.evanstexas.com/cai/simsinst/m_anal.htm, 3 pages, (at least as early as Dec. 5, 2003).

"Secondary Ion Detectors", Charles Evans & Associates, http://www.evanstexas.com/cai/simsinst/detector.htm, 4 pages, (at least as early as Dec. 5, 2003).

"Secondary Ion Mass Spectrometry Instrumentation Tutorial", Charles Evans & Associates, http://www.evanstexas.com/cai/simsinst/caisinst.htm, 1 page, (at least as early as Dec. 5, 2003).

"The CEA® Online Tutorial," The Evans Analytical Group Online Tutorial, http://www/evanstexas.com/tutorial. htm, 2 pages, (at least as early as Dec. 5, 2003).

"ion", Dictionary of Science and Technology, Academic Press, Harcourt, Inc., http://www.Harcourt.com/dictionary, 2 pages, (at least as early as Oct. 28, 2003).

"Photomultiplier Tubes", Brochure, Hamamatsu, 4 pages, (date unknown).

Brown et al., "Failure Analysis of Plastic Encapsulated Components–the Advantages of IR Microscopy", Journal of Microscopy, vol. 148, Pt. 2, pp. 179–194 (Nov. 1987).

Fischer, Albert K., et al., "Adaptation of an ION Microprobe for ION Bombardment of Liquid Metals", Rev. Sci. Instrum., vol. 48, No. 3, pp. 219–220 (Mar. 1977).

Hannemann, U., et al., "Effect of Cr and Ta Buffers on Hard Magnetic $Nd_2Fe_{14}B$ Films", Journal of Magnetism and Magnetic Materials, 10 pages (2002).

Kolac, U., et al., "High–Performance GaAs Polarized Electron Source for Use in Inverse Photoemission Spectroscopy", Rev. Sci. Instrum. 59 (9), pp. 1933–1940 (Sep. 1988).

Cerrina, F., "The Schwarzschild Objective", Chapter 27, pp. 27.1–27.5 (date unknown).

Liebl, H., "A Coaxial Combined Electrostatic Objective and Anode Lens for Microprobe Mass Analysers", Pergamon Press Ltd., vol. 22, No. 11, pp. 619–621 (Jul. 10, 1972).

Hinthorne, James R., et al., "Microanalysis for Fluorine and Hydrogen in Silicates With the Ion Microprobe Mass Analyzer", American Mineralogist, vol. 60, pp. 143–147 (1975).

Liebl, H., "Optimal Sample Utilization in Secondary Ion Mass Spectrometry", presented at the Vth International Conference on Ion Beam Analysis in Sydney, Australia (Feb. 16–20, 1981).

Liebl, H., "Ion Probe Microanalysis", Journal of Physics E: Scientific Instruments, vol. 8, pp. 797–808 (1975).

Liebl, H., "Optimum Sample Utilization in Secondary Ion Mass Spectrometry", Nuclear Instruments and Methods, 191, pp. 183–188 (1981).

Liebl, H., "SIMS Instrumentation and Imaging Techniques", Scanning, vol. 3, pp. 79–89 (1980).

Barbier, J., et al., "Khmaralite, a New Beryllium–Bearing Mineral Related to Sapphirine: A Superstructure Resulting From Partial Ordering of Be, Al, and Si on Tetrahedral Sites", American Mineralogist, vol. 84, pp. 1650–1660 (1999).

Morrison, G., et al., "Ion Microscopy", Analytical Chemistry, vol. 47, No. 11, pp. 933A–943A (Sep. 1975).

Sturrock, P., "Composition Analysis of the Brazil Magnetism", http://www.nicap.dabsol.co.uk/ubatubanal.htm, pp. 1–29 (at least as early as Dec. 5, 2003).

Wegmann, L., "Progress Towards a Metallurgical Electron Microscope", Article, originally presented in part at the German Electron Microscopy Conference, Marburg, pp. 240–263 (1967).

Tamura, H., "The Scanning Ion Microscope and Its Application", Article, pp. 423–429 (date unknown).

Hervig, R., "Analyses of Geological Materials for Boron By Secondary Ion Mass Spectrometry", RiM, vol. 33, Chapter 16 (date unknown).

"Optical Instruments–Contrast Generation," Microscopes (pp. 17.22–17.25) (date unknown).

\* cited by examiner

COLUMN SIMULTANEOUSLY FOCUSING A PARTILCE BEAM AND AN OPTICAL BEAM

CROSS-REFERENCE TO RELATED APPLICATIONS (Not Applicable)

STATEMENT REGARDING FEDERALLY SPONSORED RESEARCH OR DEVELOPMENT (Not Applicable)

INCORPORATION-BY-REFERENCE OF MATERIAL SUBMITTED ON A COMPACT DISC (Not Applicable)

BACKGROUND OF THE INVENTION (1) Field of the Invention

This invention relates that to an optical column for simultaneously focusing an ion beam and a photon beam onto the same region.

The invention is particularly useful in the field of analysis and repair and manufacture of integrated circuits.

(2) Description of Related Art

Focused ion beams such as ion or electron beams are currently widely used for various types of integrated circuit analysis and manufacturing operations, notably characterisation, identification, design and failure analysis, depassivation, vapor phase deposition, micro-machining, etc. These operations are performed using a particle beam production column designed to be focused onto the integrated circuit at the place intended for the desired intervention.

Such a column typically comprises a source of ions such as Ga+ produced from liquid metal which, after extraction, form an ion beam, which is then manipulated by a focusing device comprising a certain number of electrodes operating at determined potentials so as to form an electrostatic lens system adapted to focus the ion beam onto the integrated circuit. Each electrode of the focusing device, notably the output electrode, consists of a series of metallic electrodes having an aperture for passage of the particle beam. It should be noted here that the shape of the various electrodes as well as the aperture diameter plays a determining part in aberrations, notably spherical and chromatic aberration, of the particle focusing device.

One of the limits of applying focused ion beams is the impossibility of employing them to provide an in-depth image of a solid. Only surface images can be obtained. In the case of passivated and planarized integrated circuits, a surface image gives no information on the underlying layers and circuits, which has the disadvantage of making any intervention in the depth of the circuit extremely difficult such as, in particular, the cutting or breaking of buried metal tracks made necessary by design and failure analysis. To overcome this disadvantage, we employ an auxiliary light (photon) beam simultaneously and coaxially focused with the particle beam. In effect, using the light beam to obtain images in the thickness of the circuits, it is possible to visualize layers and tracks in depth and explore them, in real time, using the ion beam. It will now be understood that associating two types of beam, an ion and a photon beam, allows the operator to bring the ion beam exactly to the desired point on the object by means of the image supplied by the light beam.

Certain ion beam production columns also include an optical focusing device, a Cassegrain-Schwartzfeld (C-S) mirror objective lens for example, terminating at an outlet aperture placed close to the surface of a sample subjected to the ion beam.

French patent 2,437,695 discloses an emission ion lens associated with a C-S type mirror objective lens.

In this system, the ionic lens part, the elements of which consist of two perforated electrodes and of the sample itself, is located between the object and the mirror objective lens.

In this configuration, the apertures in the ion focusing device electrodes must simultaneously be sufficiently large to provide a geometrical expanse for the optical beam allowing sufficient sample illumination, and, relatively small so as not to deteriorate ion beam quality through excessive aberrations. The final diameter chosen for the outlet aperture is consequently a trade-off which is not satisfactory either for the optical beam extent or for ion beam focusing.

Secondly, the system disclosed in French patent 2,437,695 necessitates a very small (a few millimetres) working distance and the submitting of the sample to an electrical field. These two constraints are unacceptable in focused ion beam technology applied to integrated circuits: the danger of destroying the circuits by micro-electrostatic breakdown, impossibility of slanting the sample, difficulty in collecting secondary electrons, and the practical impossibility, through lack of space, of associating the system with a capillary tube for injecting pre-cursor gas which is an essential accessory in focused ion beam technology.

BRIEF SUMMARY OF THE INVENTION

Thus, the technical problem to be resolved by the subject matter of this invention is to provide a focused particle beam production column comprising:

a device for focusing said particles carrying an output electrode having an outlet aperture for the passage of said particle beam, an optical focusing device for simultaneously focusing a light beam, carrying an outlet opening, such column making it possible to associate:

a comfortable working distance of the order of 15 to 20 mm;

a final ionic lens having chromatic and spherical aberration coefficients of the order of magnitude of aberration coefficients encountered in conventional ionic lenses;

a sufficient numerical aperture for the mirror optics, of the order of 0.3; and zero electric field on the object.

The solution to the technical problem posed consists, according to this invention, in that the outlet opening is transparent to said light beam, said output electrode being formed by a metal insert held in said opening and carrying a central aperture forming said outlet aperture.

Thus, the column of the invention introduces independence between outlet aperture diameter of the particle focusing device and outlet aperture diameter of the optical focusing device. It is thus possible to adjust central aperture diameter of the metal insert to an optimum value for reducing output electrode aberrations, without this in any way prejudicing optical beam numerical aperture, the latter being determined by the diameter of the aperture transparent to the optical beam.

According to one embodiment of the invention, provision is made for the particle focusing device, with said particle focusing device including an intermediate electrode, for the metal insert to project from the opening towards the intermediate electrode. In this way, if electrical breakdown were to accidentally occur between the output electrode and the intermediate electrode, this has maximum probability of occurring at the metal insert, thereby protecting the means for supporting said metal insert, notably the surface treatment of a transparent window of the outlet aperture.

The particle production column of the invention is suited to a great number of applications including:

treatment of a sample with a charged particle beam using information supplied by the optical beam and, in particular, precise investigation of the effects of a particle beam on an integrated circuit by means of information supplied by the optical beam, treatment of a sample requiring use of a laser focused onto said sample and, in particular, removal of integrated circuit layers by laser with or without chemical assistance, allowing etching or milling at a finer and more local scale, assisted deposition, or electron or ion beam analysis, integration of electron or ion beams with infra-red microscopy for integrated circuit analysis, laser chemical etching allowing milling of integrated circuits by ionic beam or electron beam probing, display of optical transitions created, for example, by the effect of ion beams or other light phenomena appearing on a sample, laser marking of integrated circuits, electron beam probing of diffusion in integrated circuits or other samples, cancelling of the effects of static charges by UV photons when performing focused electron or ion treatment, spectroscopic micro-analysis of photons emitted under particle impact.

The description that follows with reference to the attached drawings, provided by way of non-limiting example, will lead to a better understanding of the invention and how it may be carried out.

BRIEF DESCRIPTION OF THE SEVERAL VIEWS OF THE DRAWING(S)

DETAILED DESCRIPTION OF THE INVENTION

Figure 1:
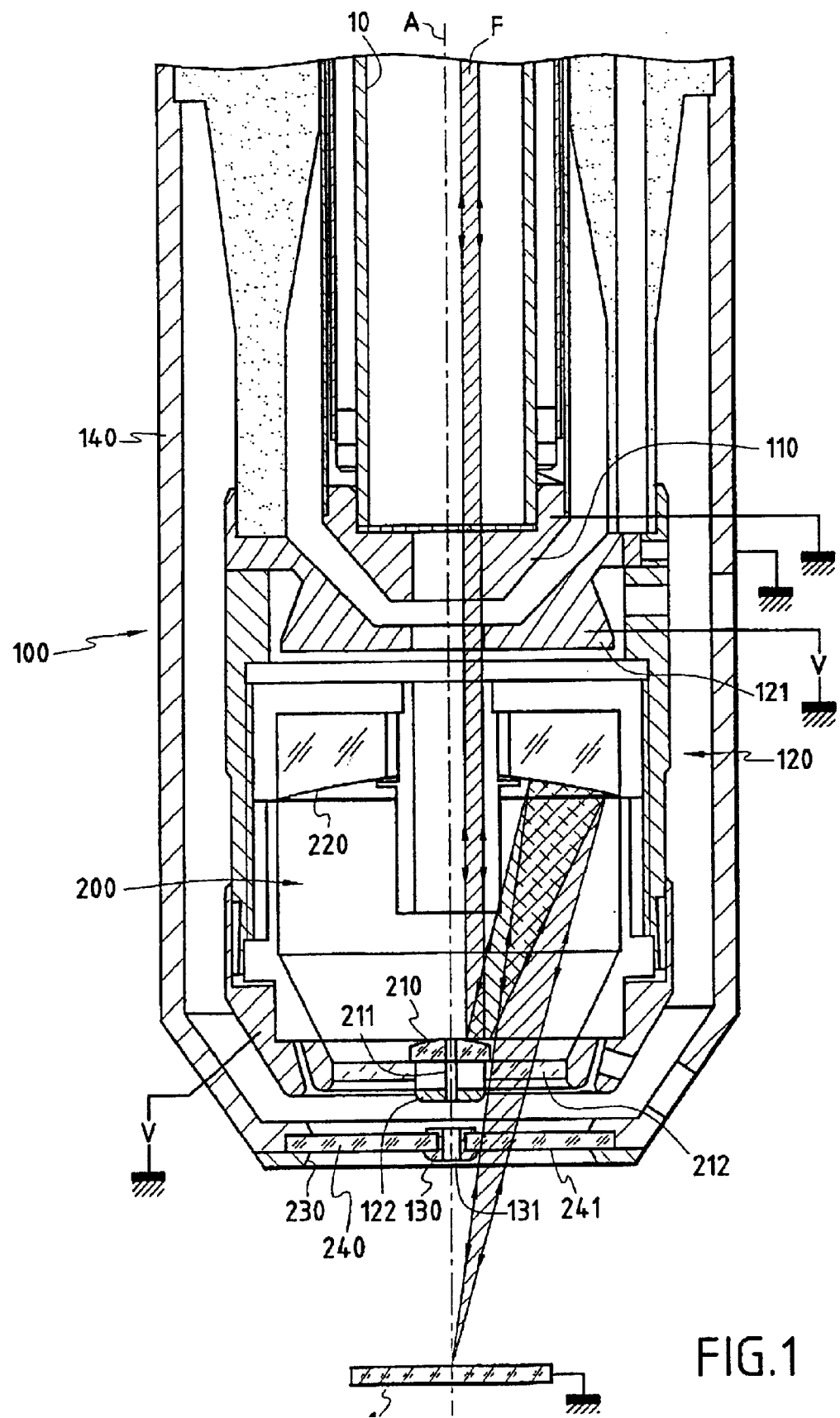
FIG. 1 is a partial side view in section of a particle beam production column according to one first embodiment of the invention.

In FIG. 1, we have partially shown, in section, a particle beam production column for focusing onto an integrated circuit 1. The particle beam axis which coincides with the column axis is identified by reference letter A. Although the column in FIG. 1 applies to all sorts of charged particles, electrons or ions, we shall take below the example of an ion beam.

Only the downstream part of the column is shown in FIG. 1, the ion source and the means for extracting and conditioning the ion beam which are known per se, not being shown.

The part of the column shown in FIG. 1 essentially comprises a device 100 for focusing the ion beam onto integrated circuit 1. This device 100 carries three electrodes, specifically an input electrode 110 which is grounded, an intermediate electrode 120 brought to a nonzero potential V which may be positive or negative for example of 20 Kev, and an output electrode 130 also grounded. These electrodes 110, 120, 130 are contained between lateral walls 140 of the column, the latter being grounded.

In fact, on FIG. 1 it can be seen that intermediate electrode 120 is a complex two-part electrode made up by a first intermediate electrode 121 arranged close to input electrode 110 and by a second intermediate electrode 122 arranged close to output electrode 130. These electrodes together form an electrostatic lens of the thick, geometrically asymmetric but electrically symmetric type.

It can be seen on FIG. 1 that an optical focusing device 200 designed to focus an optical beam F simultaneously and coaxially with the particle beam on axis A is located between the two intermediate electrodes 121, 122. This device 200 allows both optical beam F to be focused onto sample 1 thereby forming an enlarged image of the sample as well as collection of light radiation emitted by said sample or by sputtered atoms following ionic bombardment. Optical beam F is obtained from a non-illustrated light source generally arranged laterally with respect to the column with the light being re-directed parallel to axis A and by a mirror at 45° located on said axis and including an aperture for passage of the ion beam.

In the embodiment of FIG. 1, optical focusing device 200 is a Cassegrain-type mirror objective lens comprising a first convex spherical mirror 210 located in optical beam path F and a second concave spherical mirror 220 focusing onto integrated circuit 1 the beam coming from first mirror 210. The latter includes an aperture 211 for allowing the ion beam to pass through the second intermediate electrode 122, the assembly formed by the first mirror 210 and said second intermediate electrode 122 being held at the centre of the column by a metal tripod 212 providing a high degree of transparency to the light beam.

As can be seen in FIG. 1, optical focusing device 200 also carries an outlet aperture 230 itself including a window 240 that is transparent to photons of optical beam F, held by its edges to the outer housing of the grounded column. Output electrode 130 is formed by a metal insert passing through a window 240, and which is retained by said window 240 and including a central aperture at its middle 131 for the output of electrode 130. In order to ground said output electrode 130, transparent window 240 is electrically conducting. In particular, it can be glass-plated covered with at least one conducting layer 241 such as indium and/or tin oxide. It is thus possible to select a small diameter outlet for aperture 131, compatible with the resolution desired for the ion beam, while maintaining, in an independent fashion, a larger diameter opening 230, providing a geometrical expanse for the optical beam ensuring sufficient numerical aperture and thereby obtaining a high quality optical image of the sample 1 observed. Clearly, outlet window 240 could just as well be made of any bulk material transparent to photons, and electrically conducting.

In FIG. 1 it can be seen that metal insert 130 projects from the surface of window 240 towards second intermediate electrode 122, thereby protecting said window in the case of electrical breakdown, the latter occurring between insert 130 and the second electrode 122.

Figure 2:
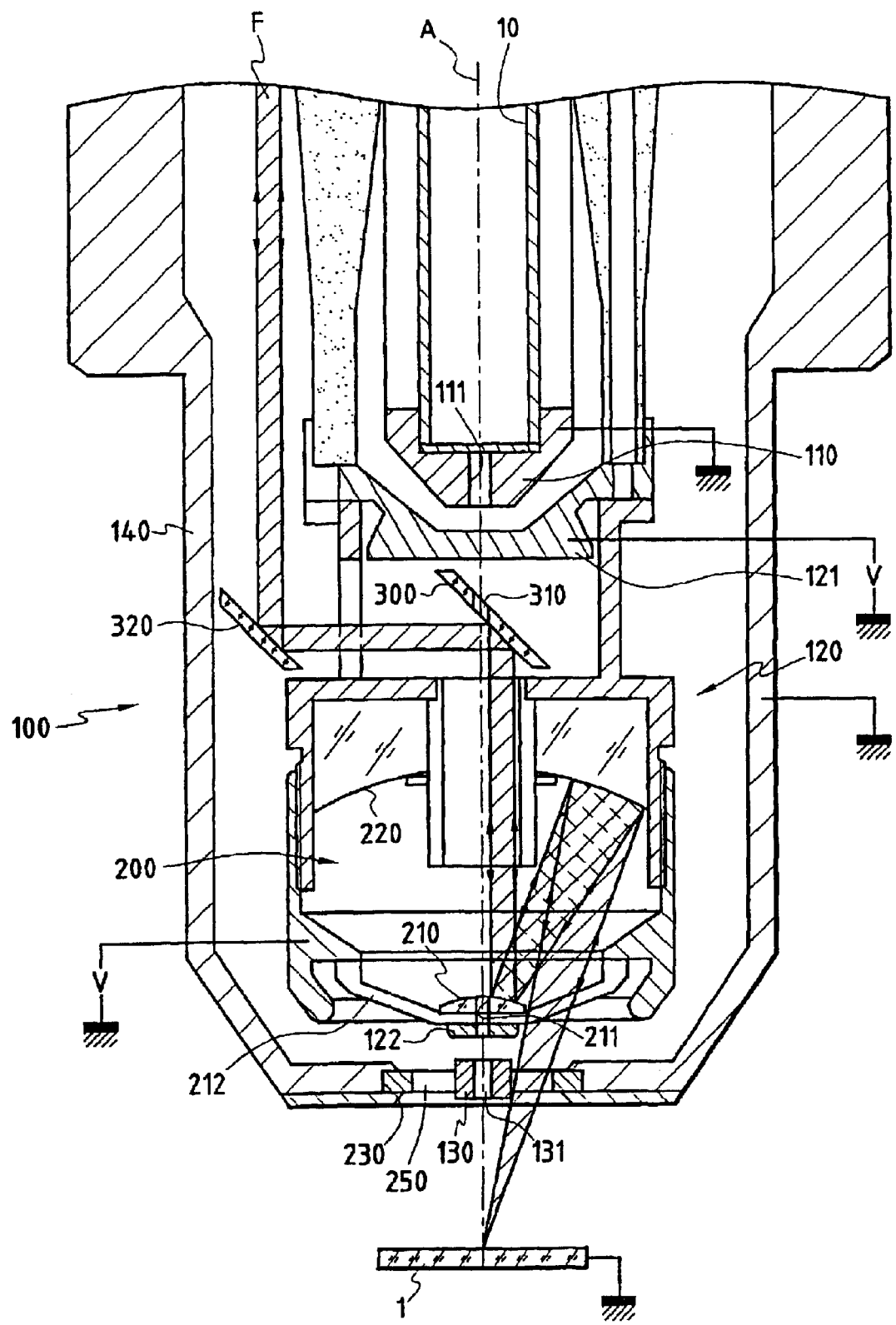
FIG. 2 is a partial side view in section of a particle beam production column according to a second embodiment of the invention.

Like the embodiment shown in FIG. 1, optical focusing device 200 of the embodiment of the invention shown in FIG. 2 is a Cassegrain-type objective lens with mirrors 210, 220 brought to a high-voltage comprised, for example, between 10 and 20 keV.

However, a first mirror 300 is located on ion beam axis A between the first intermediate electrode 121 and the second intermediate electrode 122 and, more precisely, between first intermediate electrode 121 and the Cassegrain-type objective lens with mirrors 210, 220. This mirror 300 carries an aperture 310 for passage of the ion beam. It is inclined substantially at 45° with respect to axis A in order to deflect optical beam F through about 90° laterally towards a second mirror 320 arranged in the space comprised between the lateral walls 140 of the column and part 120. This second mirror 320 is itself angled at 45° with respect to axis A. It deflects beam F through 90 degrees in the same direction as axis A, parallel to the latter.

Thus, the diameter of aperture 111 provided at the extremity of input electrode 110, designed to allow passage of ion beam A but the function of which is not, contrary to the embodiment of FIG. 1, to allow passage of the optical beam, can be reduced to values of millimetric scale order. Further, deflector plates 10 located upstream of input electrode 110 no longer require the anti-reflection treatment needed for good conduction of the optical beam. Finally, artefacts due to the light beam interacting with the walls of the ionic optical elements which did exist upstream of first mirror 300, in particular at deflector plates 10 of the embodiment in FIG. 1 and which notably decrease quality of interpretation of the images obtained, are eliminated.

Further, in the embodiment of FIG. 2, aperture 230 does not carry a window 240 but rather a set of metallic or, at the least electrically-conducting, tabs or legs. There are for example three such tabs forming a metallic tripod 250 which is retained by the edges of the outer housing of the grounded column, delimiting aperture 230. They ensure good retention of insert 150 while ensuring aperture 230 is kept transparent for the optical beam. Thus, like in the embodiment of FIG. 1, it is possible to choose, for output aperture 131, a small value of diameter compatible with the resolution required for the ionic beam, while maintaining, completely independently, a larger diameter aperture 230 offering the light beam a geometrical expanse allowing sufficient illumination of the observed sample 1.

Finally, in the embodiment of FIG. 2, the tabs or legs of metal tripod 212 designed to hold the unit formed by mirror 210 and the second intermediate electrode 122 are curved so as to increase their spacing from the legs of tripod 250 and output electrode 130. Thanks to this, risks of spark-over are limited as are distortions of the electrical field due to the tripod.

What is claimed is:

1. A process for treating a sample with a charged particle beam, comprising the steps of
   providing a column having
      a particle focusing device including an output electrode having an output aperture for the passage of a focused particle beam, and
      an optical focusing device having an outlet aperture for the passage of an optical beam.
      wherein the output electrode is supported at the outlet aperture and wherein the outlet aperture is sufficiently large to permit the optical beam to pass adjacent to the output electrode
   locating a sample on the path of a particle beam produced by said column and
   treating a sample by the charged particle beam, using information supplied by the optical beam.

2. A process for treating a sample, comprising the steps of
   providing a column having
      a particle focusing device including an output electrode having an output aperture for the passage of a focused particle beam, and
      an optical focusing device having an outlet aperture for the passage of an optical beam,
      wherein the output electrode is supported at the outlet aperture and wherein the outlet aperture is sufficiently large to permit the optical beam to pass adjacent to the output electrode
   locating a sample on the path of a light beam produced by said column and
   treating a sample by the light beam, said light beam being a laser focused onto said sample.

3. A process for analyzing an integrated circuit, comprising the steps of
   providing a column having
      a particle focusing device including an output electrode having an output aperture for the passage of a focused particle beam, and
      an optical focusing device having an outlet aperture for the passage of an optical beam,
      wherein the output electrode is supported at the outlet aperture and wherein the outlet aperture is sufficiently large to permit the optical beam to pass adjacent to the output electrode
   locating an integrated circuit on the path of a light beam and of a particle beam produced by said column,
   said particle beam comprising an electron beam and said light beam comprising an infra-red microscopy beam.

4. A process for analyzing an integrated circuit, comprising the steps of
   providing a column having
      a particle focusing device including an output electrode having an output aperture for the passage of a focused particle beam, and
      an optical focusing device having an outlet aperture for the passage of an optical beam.
      wherein the output electrode is supported at the outlet aperture and wherein the outlet aperture is sufficiently large to permit the optical beam to pass adjacent to the output electrode
   locating an integrated circuit on the path of a light beam and of a particle beam produced by said column,
   said particle beam comprising an ion beam and said light beam comprising an infra-red microscopy beam.

5. A process for engraving an integrated circuit, comprising the steps of
   providing a column having
      a particle focusing device including an output electrode having an output aperture for the passage of a focused particle beam, and
      an optical focusing device having an outlet aperture for the passage of an optical beam.
      wherein the output electrode is supported at the outlet aperture and wherein the outlet aperture is sufficiently large to permit the optical beam to pass adjacent to the output electrode
   locating an integrated circuit on the path of a laser beam and of an ionic beam produced by said column,
   engraving said integrated circuit by laser chemical etching and milling by ionic beam.

6. A process for engraving an integrated circuit, comprising the steps of
   providing a column having
      a particle focusing device including an output electrode having an output aperture for the passage of a focused particle beam, and
      an optical focusing device having an outlet aperture for the passage of an optical beam.

wherein the output electrode is supported at the outlet aperture and wherein the outlet aperture is sufficiently large to permit the optical beam to pass adjacent to the output electrode locating an integrated circuit on the path of a laser beam and of an electron beam produced by said column, engraving said integrated circuit by laser chemical etching while probing said integrated circuit with the electron beam.

7. A column for simultaneously producing a focused particle beam and a focused light beam, the column comprising:

a particle focusing device including an output electrode having an output aperture for the passage of a focused particle beam, and an optical focusing device having an outlet aperture for the passage of an optical beam, wherein the output electrode is supported at the outlet aperture and wherein the outlet aperture is sufficiently large to permit the optical beam to pass adjacent to the output electrode.

8. The column according to claim 7, wherein the particle-beam focusing device has an axis and the optical focusing device focuses the optical beam coaxially with the focused particle beam onto a sample.

9. The column according to claim 7, wherein the output electrode is formed by a metal insert.

10. The column according to claim 7, wherein said optical focusing device includes an objective lens with at least two mirrors, curved electrically-conducting tabs retaining a unit formed by a mirror of said objective lens and the second intermediate electrode.

11. The column according to claim 7, wherein said particle focusing device comprises a two-part intermediate electrode having a first intermediate electrode and a second intermediate electrode, wherein said second intermediate electrode is arranged close to said output electrode and wherein said optical focusing device is located between said first intermediate electrode and second intermediate electrode.

12. The column according to claim 11, wherein said particle focusing device comprises an input electrode arranged close to said first intermediate electrode, wherein said input electrode and output electrode are grounded and wherein said intermediate electrode is brought to a non-zero potential.

13. The column according to claim 11, further comprising a first mirror located on an axis of said particle beam between the first intermediate electrode and the second intermediate electrode, wherein said first mirror is inclined with respect to said axis and deflects said optical beam laterally towards a second mirror and wherein said first mirror is provided with an aperture for the passage of said particle beam.

14. The column according to claim 9, wherein said outlet opening includes a set of electrically-conducting legs retaining said metal insert.

15. The column according to claim 9, wherein said particle focusing device includes an intermediate electrode and wherein sa d metal insert projects from said outlet aperture towards said intermediate electrode.

16. The column according to claim 9, wherein said outlet opening includes a set of electrically-conducting tabs retaining said metal insert.

17. The column according to claim 9, wherein said outlet aperture includes a window retaining said metal insert.

18. The column according to claim 17, wherein said window comprises a glass plate, covered with at least one thin layer of an electrically-conducting material transparent to photons.

19. The column according to claim 17, wherein said window comprises a plate of a photon-transparent material, covered with at least one thin layer of an electrically-conducting material transparent to photons.

20. The column according to claim 17, wherein said window comprises a transparent and electrically-conducting bulk material.

* * * * *